US010223886B2

(12) United States Patent
Warzelhan et al.

(10) Patent No.: US 10,223,886 B2
(45) Date of Patent: Mar. 5, 2019

(54) MONITORING INSTALLATION FOR A MONITORING AREA, METHOD AND COMPUTER PROGRAM

(71) Applicant: Robert Bosch GmbH, Stuttgart (DE)

(72) Inventors: Jan Karl Warzelhan, Bad Salzdetfurth Ot Heinde (DE); Daniel Gottschlag, Nuremberg (DE); Frank Mattern, Lauf an der Pegnitz (DE); Jan Rexilius, Hannover (DE); Holger Fillbrandt, Bad Salzdetfurth (DE); Stephan Heigl, Hannover (DE)

(73) Assignee: Robert Bosch GmbH, Stuttgart (DE)

( * ) Notice: Subject to any disclaimer, the term of this patent is extended or adjusted under 35 U.S.C. 154(b) by 231 days.

(21) Appl. No.: 14/650,590

(22) PCT Filed: Dec. 10, 2013

(86) PCT No.: PCT/EP2013/076118
§ 371 (c)(1),
(2) Date: Jun. 9, 2015

(87) PCT Pub. No.: WO2014/090819
PCT Pub. Date: Jun. 19, 2014

(65) Prior Publication Data
US 2015/0332569 A1 Nov. 19, 2015

(30) Foreign Application Priority Data
Dec. 10, 2012 (DE) .................. 10 2012 222 661

(51) Int. Cl.
*G08B 13/196* (2006.01)
*H04N 7/18* (2006.01)
(Continued)

(52) U.S. Cl.
CPC ..... *G08B 13/19682* (2013.01); *G06F 17/5009* (2013.01); *G08B 25/14* (2013.01); *G08B 27/003* (2013.01); *H04N 7/183* (2013.01)

(58) Field of Classification Search
CPC ............ G08B 13/19682; G08B 27/003; G08B 25/14; G08B 13/19608; G08B 13/19645;
(Continued)

(56) References Cited

U.S. PATENT DOCUMENTS 6,070,098 A * 5/2000 Moore-Ede .......... A61B 5/1103
600/300
7,382,244 B1 * 6/2008 Donovan ......... G08B 13/19645
340/506

(Continued)

FOREIGN PATENT DOCUMENTS

DE 102007054819 5/2009
DE 102008042391 4/2010
(Continued)

OTHER PUBLICATIONS

International Search Report for Application No. PCT/EP2013/076118 dated Jun. 10, 2014 (English Translation, 3 pages).

*Primary Examiner* — Dramos Kalapodas
(74) *Attorney, Agent, or Firm* — Michael Best & Friedrich LLP

(57) ABSTRACT

In spacious areas or building complexes, it is customary to use monitoring systems that comprise monitoring cameras and other monitoring sensors that record monitoring data and forward said monitoring data to a monitoring control centre or the like for the purpose of evaluation. Depending on the size of the monitored area, the complexity of the monitoring system can increase to a great extent. Upwards of a certain size of monitoring area, it is necessary for several monitoring persons also to be employed in parallel in order to inspect the monitoring data. A monitoring instal-
(Continued)

lation 1 for a monitoring area B having a plurality of monitoring stations 3a, b, c, d for users 6a, b, c, d of the monitoring installation 1, wherein the monitoring installation 1 is designed to assign a respective user ID ID_6a, ID_6b, ID_6c, ID_6d to the users 6a, b, c, d of the monitoring installation 1, wherein the monitoring stations 3a, b, c, d each have a display device 8a, b, c, d, wherein the monitoring stations 3a, b, c, d are designed to present a user interface 9a, b, c for the monitoring installation 1 having a model 10 of the monitoring area 10 on the display device 8a, b, c, d, and having a collaboration device 12, wherein the collaboration device 12 is designed to show a first of the user IDs ID_6a from a first monitoring station 3a together with an associated piece of user information as collaboration data with the model 10 on the user interface 9a, b, c of at least one second monitoring station 3b, c, is proposed.

17 Claims, 2 Drawing Sheets

(51) Int. Cl.
*G06F 17/50* (2006.01)
*G08B 25/14* (2006.01)
*G08B 27/00* (2006.01)

(58) Field of Classification Search
CPC ............ G08B 13/19656; H04N 7/183; H04N 13/0239; H04N 2013/0081; H04N 5/76; H04N 13/0203; H04N 7/181; H04N 7/15; G06F 17/5009; G06F 21/604; G06F 21/55; G06F 17/30545; G06F 9/541; G06F 9/546; G06F 11/3668; G06F 21/00; G06F 17/30873; G06F 17/30056; G06F 17/30058; G06F 15/16; G06F 3/00; G01S 3/7864; G06K 9/00778; G06K 9/00302; G06K 9/00771; G07C 9/00158; G06Q 10/06; G06T 7/70; G06T 7/292; G06T 2207/30244; H04L 67/12; H04L 67/1095; H04L 29/06; H04L 12/1813; H04L 12/66; H04L 51/04; Y10S 707/99948
See application file for complete search history.

(56) References Cited

U.S. PATENT DOCUMENTS

| | | | | |
|---|---|---|---|---|
| 7,627,810 | B2* | 12/2009 | Glazer | G06F 17/30038 707/999.104 |
| 7,930,348 | B2* | 4/2011 | Kusuda | H04L 12/66 709/201 |
| 7,966,370 | B1* | 6/2011 | Pegg | H04N 7/15 707/608 |
| 8,230,349 | B2* | 7/2012 | Subbian | H04L 12/1827 382/103 |
| 9,191,633 | B2* | 11/2015 | Fujimatsu | H04N 7/181 |
| 2003/0202101 | A1 | 10/2003 | Monroe et al. | |
| 2005/0007249 | A1* | 1/2005 | Eryurek | G05B 23/027 340/511 |
| 2008/0198159 | A1* | 8/2008 | Liu | G08B 13/19641 345/420 |
| 2009/0070681 | A1* | 3/2009 | Dawes | G06F 17/30873 715/736 |
| 2010/0066559 | A1 | 3/2010 | Judelson | |
| 2010/0201821 | A1* | 8/2010 | Niem | G06K 9/00268 348/159 |
| 2010/0245107 | A1* | 9/2010 | Fulker | G06F 17/30873 340/691.6 |
| 2010/0293220 | A1* | 11/2010 | Gennari | G08B 13/19645 709/202 |
| 2011/0107153 | A1* | 5/2011 | Shufer | G06F 11/3668 714/45 |
| 2011/0109717 | A1* | 5/2011 | Nimon | H04N 7/15 348/14.09 |
| 2012/0011126 | A1* | 1/2012 | Park | G06F 9/541 707/741 |
| 2012/0016607 | A1* | 1/2012 | Cottrell | G05B 23/0229 702/62 |
| 2012/0278408 | A1* | 11/2012 | Seferian | G06Q 10/1095 709/206 |
| 2012/0293605 | A1* | 11/2012 | Seferian | H04N 7/147 348/14.08 |
| 2015/0168144 | A1* | 6/2015 | Barton | G01C 11/02 348/144 |

FOREIGN PATENT DOCUMENTS

| | | |
|---|---|---|
| EP | 1463325 | 9/2004 |
| EP | 2200310 | 6/2010 |
| WO | 2009105603 | 8/2009 |

* cited by examiner

MONITORING INSTALLATION FOR A MONITORING AREA, METHOD AND COMPUTER PROGRAM

BACKGROUND OF THE INVENTION

The invention relates to a monitoring installation for a monitoring area, having a plurality of monitoring stations for users of the monitoring installation, the monitoring installation being designed to assign a user ID to each of the users of the monitoring installation, the monitoring stations each having a display device, the monitoring stations being designed to present a user interface of the monitoring installation with a model of the monitoring area on the display device. The invention also relates to a method and a computer program for the monitoring installation for this purpose.

In spacious areas or building complexes, it is conventional to use monitoring systems comprising monitoring cameras and other monitoring sensors which record monitoring data and forward the latter to a monitoring center or the like for evaluation. Depending on the size of the area monitored, the complexity of the monitoring system may increase greatly. As of a certain size of the monitoring area, it is necessary to also use a plurality of monitoring persons in a parallel manner for the purpose of controlling the monitoring data.

The document DE 10 2007 054 819 A1 which probably forms the closest prior art discloses such a monitoring system which is designed to monitor a plurality of monitoring areas and can be controlled by at least one human observer. The monitoring system perceives the human observer as part of the monitoring system and it is proposed to provide a state detection module which determines the monitoring state of the observer on the basis of optically detected state signals from the observer.

SUMMARY OF THE INVENTION

A monitoring installation which is designed and/or suitable for monitoring a monitoring area is proposed. The monitoring area may be in the form of a contiguous monitoring area or alternatively in the form of a fragmented or divided monitoring area having a plurality of sections. The monitoring area may be, for example, public buildings or spaces, for example libraries, hospitals, airports, prisons, railway stations, inner cities, venues etc. Alternatively, the monitoring areas may also be private or commercial spaces or buildings, for example fabrication plants, storage spaces, general business complexes etc.

The monitoring installation is connected or can be connected to a plurality of safety devices which can preferably be subdivided into monitoring sensors and monitoring actuators. The monitoring sensors can be understood as meaning, in particular, monitoring cameras, motion detectors, access control devices, fire detectors, temperature sensors, emergency call indicators etc. The monitoring actuators are in the form of turnstiles, fire doors, escape doors, escalators etc., for example. In particular, the monitoring installation may be in the form of a video monitoring system, a building management system, an access control system or an emergency call system. The monitoring installation is in the form of a computer network system, in particular.

The monitoring installation comprises a plurality of monitoring stations for users of the monitoring installation. The users are in the form of monitoring personnel, in particular.

The monitoring installation, in particular the monitoring stations, is/are designed to assign a unique user ID to each of the users of the monitoring installation. The user ID makes it possible to refer to the user of the monitoring stations and not only to the monitoring station as such. In particular, the user is allocated the same user ID if the user changes from one monitoring station to a next monitoring station. In the simplest case, the user ID may be in the form of the real user name of the user. Alternatively, the user ID may be selected to be an avatar or a company number.

The monitoring stations each have a display device. It is optionally possible for further monitoring stations to be integrated in the monitoring installation, which monitoring stations have an alternative design. The monitoring stations are designed, in terms of programming and/or circuitry, to present a user interface of the monitoring installation with a model of the monitoring area on the display device.

The user interface may be, in particular, a graphical user interface. In particular, the graphical user interface allows interaction with the monitoring station via graphical symbols. The graphical symbols may be controlled, for example, using a pointing device such as a mouse. The model may be in the form of a 2-D model (for example from the bird's eye perspective) or in the form of a 3-D model of the monitoring area. It is therefore possible for the model to be presented as an outline of the monitoring area, as a three-dimensional tier or plane of the monitoring area or for the monitoring area as a 3-D model in its entirety. The model allows the users to quickly assign events in the monitoring area to a position in the monitoring area.

The invention proposes that the monitoring installation has a collaboration device which is designed to display a first of the user IDs of a first monitoring station together with an item of user information assigned to the first user ID as collaboration data together with and/or at the same time as the model on the user interface of at least one second monitoring station.

It should be pointed out that the role of the user having the first user ID can be assumed at each monitoring station. Within the scope of the invention, a user having a second, third or nth user ID is taken as a basis for displaying the collaboration data for a second, third or nth monitoring station.

The invention is based on the consideration that, in the case of previous monitoring systems, the monitoring personnel works in a parallel and independent manner, for example according to particular work instructions and divisions or particular monitoring areas, the monitoring systems being designed, for example, in such a manner that each user independently evaluates images from monitoring cameras or reacts to incoming alarms. The advantage of the invention is that communication between a plurality of users of the monitoring installation is enabled in the system architecture of the monitoring installation in order to be able to better manage the monitoring tasks by means of collaboration. The invention also allows the tasks which arise to be able to be distributed among the monitoring personnel as required. For example, no tasks may arise in one area and tasks may accordingly arise more in another area, which cannot be (sufficiently) managed by a user allocated to said tasks. In preferred embodiments, the invention makes it possible for tasks to be actively forwarded using the user information or for overloading of individual users of the monitoring personnel to be able to be detected by the other users. The system therefore helps to be able to prioritize tasks and to make working/monitoring more efficient.

In particular, the collaboration device may be activated by the user by virtue of the user inputting the user information to the collaboration device or selecting said user information or can automatically become active by virtue of the monitoring installation determining the user information relating to the user and communicating it to at least one other user by means of the visualization.

In this case, it is particularly advantageous that the collaboration data are displayed together with the model of the monitoring area on the user interface since the collaboration data can be grasped by the users in this manner during monitoring operation. There is no need to change from the user interface having the model to a list display for displaying user data, for example. The collaboration device therefore means that the users can receive user information from the other users as a result of the collaboration data being visualized on the user interface together with the model.

If the system architecture is considered, it is preferred that the collaboration device has a plurality of collaboration modules, the collaboration modules being assigned to the monitoring stations. The collaboration modules are either connected to one another directly or are connected to one another via a server using data technology in order to distribute the collaboration data among one another. In this case, the collaboration modules may be, for example, in the form of clients to the server which receives collaboration data from the collaboration modules and transmits said data to the latter. Alternatively, it is also possible for the collaboration modules to be arranged in a peer-to-peer architecture and to operate without a server.

In one preferred refinement of the invention, the monitoring installation has a user management module for managing the users, which user management module is designed to assign the user ID to each user of the monitoring installation. The user ID is therefore centrally allocated by the monitoring installation and is used by the collaboration device. The collaboration device therefore forms an integral part of the monitoring installation and accesses data stocks of the monitoring installation.

In one preferred refinement of the invention, the monitoring installation comprises a plurality of safety devices, the user information of the collaboration data comprising an item of status information relating to the user having the first user ID with respect to the safety device.

If a monitoring camera is referred to as one of the safety devices, for example, an item of status information relating to the user may comprise the information stating that the user having the first user ID is currently displaying the monitoring images from the monitoring camera on the display device of his monitoring station. In this manner, the other users are informed that that section of the monitoring area which is assigned to the monitoring camera is being checked by the user having the first user ID, with the result that the other users can concentrate on other sections of the monitoring area. This effectively avoids duplicate monitoring of a section.

Another exemplary embodiment relates to an item of status information relating to the control of one of the safety devices, in which case the practice of displaying the collaboration data on the user interface for the other users ensures that the situation is excluded in which two users simultaneously wish to control the same safety device. The control may be both the control of a monitoring sensor, for example a monitoring camera, in particular a PTZ camera (pan-tilt-zoom camera), and the control of a monitoring actuator, for example an escape door, a turnstile or the like.

The status information may also be the information stating that the user having the first user ID is processing an alarm message from one of the safety devices, thus ensuring that there is no duplicate processing of the alarm message.

The status information is particularly preferably automatically determined and visualized by the collaboration device. The collaboration device particularly preferably uses data from the monitoring installation to determine the status information.

In one preferred development of the invention, the collaboration data are displayed in the correct position in the model by virtue of the collaboration data being graphically assigned to the safety devices in the model. The graphical assignment can be carried out using text fields, for example, which assignment is connected to the graphically presented safety device via a graphical connecting element, for example a connecting line. However, provision may also be made for the collaboration data to be directly entered in the graphical presentation of the safety device.

In one possible development of the invention, a transmitting module is assigned to the monitoring stations, which transmitting module forms part of the collaboration device and particularly preferably forms part of the collaboration module. The transmitting module makes it possible for the user having the first user ID to transmit a message as user information with his user ID as collaboration data to another user, to some other users or to all other users of the collaboration device. This makes it possible for the user to deliberately transmit a message to another user, in particular a named user, a named user group or as a "broadcast" to all other users of the monitoring installation.

In principle, it is possible that the collaboration data comprising the user ID and the message from the user ID are displayed together with the model at any desired position on the user interface. In one possible development of the invention, the monitoring stations are entered in the model, in which case provision may preferably be made for the collaboration data to be displayed in the correct position by virtue of the collaboration data being graphically assigned to the position of the monitoring station of the transmitting user in the model.

In one preferred development of the invention, the message comprises monitoring data relating to the safety devices, for example images or image sequences from one or more monitoring cameras as safety devices. In this development, it is possible for a user to send work-related information to another user as a message. For example, the message can be used to forward an alarm message to other users for processing. This development also makes it possible to assist with a division of labor among the users by virtue of monitoring data or alarm messages being forwarded to other users in whose working area the processing of particular events falls. Another advantage arises if users having different user rights are working in the monitoring installation. A user, as the user having the first user ID who is not authorized to examine recorded monitoring material, in particular video material, for example, can communicate directly with a user having this authorization in order to request further information. In this context, it is also possible for object information to be released for the user having the first user ID by the other user depending on the situation.

In one possible development of the invention, an annotation module is assigned to the monitoring stations. In particular, the collaboration device, in particular each collaboration module, comprises one of the annotation modules. The annotation module is designed such that the user having the first user ID can graphically add an annotation as user information with his user ID to the model. The annotation module makes it possible for the user to mark areas in the model and to enrich these areas with visual and/or textual information. This marking is transmitted by the collaboration device to at least one, some or all monitoring stations belonging to other users and is accordingly visualized on the display devices. In this manner, the user can take note of current events such as repair work in the model, for example.

Provision is preferably made for the annotations to have a defined validity period, with the result that said annotations are masked after a predefined time and can optionally be restored when reproducing stored information. Provision is preferably made for the annotations to be able to be processed or commented on by the other users.

Provision is particularly preferably made for the monitoring stations to be in the form of stationary devices which are arranged in a stationary manner. An alternative refinement of the invention provides for the first monitoring station to be in the form of a mobile monitoring station, the user information comprising an item of location information, the collaboration data being displayed in the correct position in the model by virtue of the collaboration data being graphically assigned to the position of the mobile monitoring station in the model.

The invention also relates to a method and a computer program having program code means.

BRIEF DESCRIPTION OF THE DRAWINGS

Further features, advantages and effects of the invention emerge from the following description of a preferred exemplary embodiment of the invention and from the accompanying drawings, in which.

DETAILED DESCRIPTION

Figure 1:
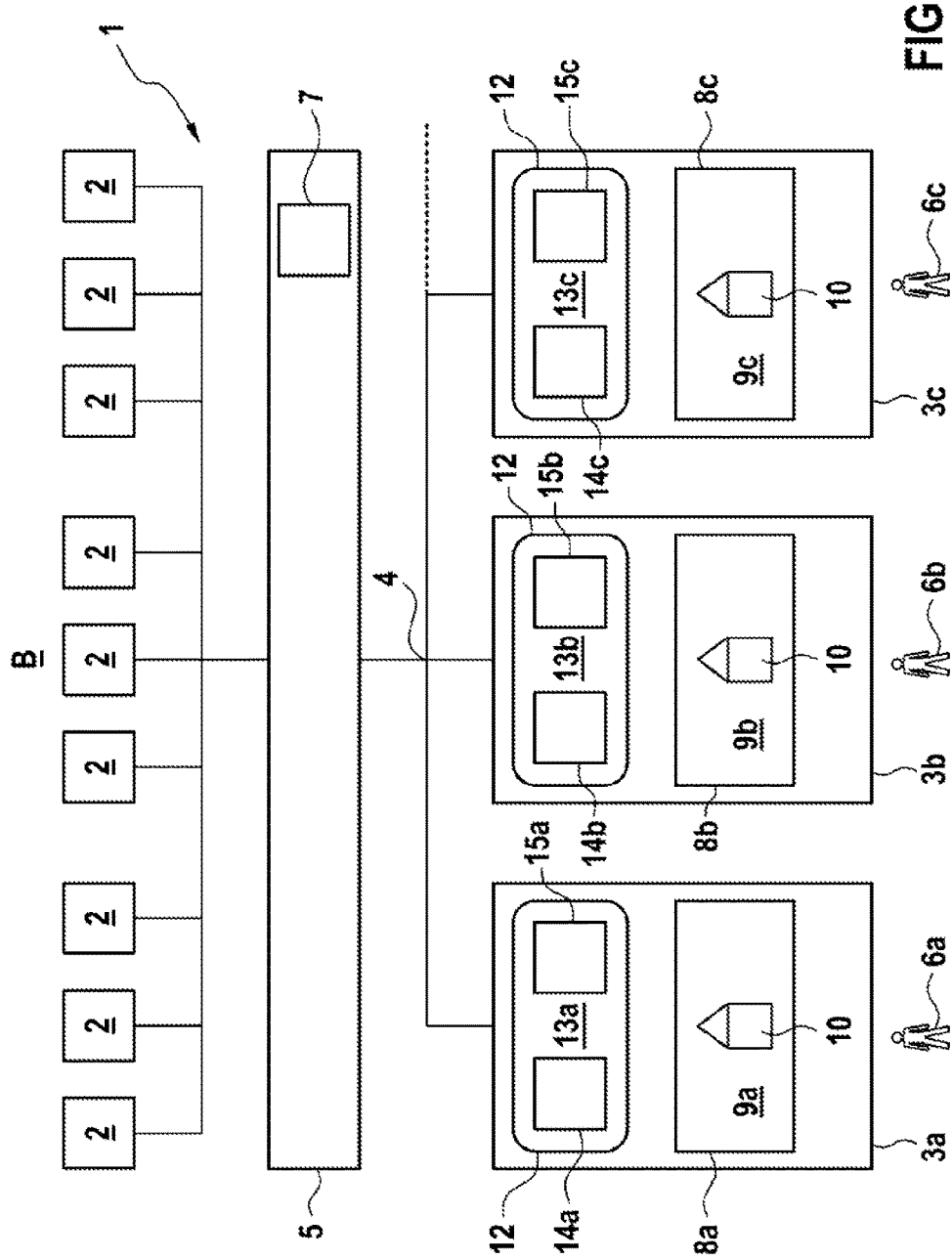
FIG. 1 shows a block diagram of a monitoring installation as an exemplary embodiment of the invention.

FIG. 1 shows, in the form of a schematic block diagram, a monitoring installation 1 as an exemplary embodiment of the invention. The monitoring installation 1 is connected to a plurality of safety devices 2 or comprises the latter, the safety devices 2 being able to be in the form of monitoring sensors or monitoring actuators. The safety devices 2 are distributed in a monitoring area B. The monitoring area B may be in the form of a building complex or the like, for example.

The monitoring installation 1 comprises a plurality of monitoring stations 3a, b, c which are designed for users 6a, b, c of the monitoring installation 1, in particular in the form of workstations for the users 6a, b, c. The monitoring stations 3a, b, c are connected to one another and to a monitoring center 5 via a network 4. The monitoring center 5 may be, for example, in the form of a server in the form of a computer; the monitoring stations 3a, b, c may be in the form of clients likewise in the form of further computers. Alternatively, it is also possible for the monitoring installation 1 to be in the form of a peer-to-peer network. The monitoring installation 1 may have further identical or else differently designed monitoring stations 3a, b, c.

Each of the monitoring stations 3a, b, c may be operated by a user 6a, b, c, the monitoring installation 1 being designed to assign a unique user ID to the users 6a, b, c upon registration with the monitoring stations 3a, b, c. For this purpose, the monitoring center 5 has a user management means 7, for example. Alternatively, the monitoring stations 3a, b, c may have user modules which assign unique user IDs to the users 6a, b, c.

The monitoring stations 3a, b, c each have a display device 8a, b, c, for example a screen, a graphical user interface 9a, b, c being represented or being able to be represented with a model 10 of the monitoring area B of the monitoring installation 1 on the display device 8a, b, c during operation of the monitoring installation 1 or the monitoring stations 3a, b, c.

The monitoring stations 3a, b, c make it possible to display the model 10 of the monitoring area B and possibly messages or monitoring data from the safety devices 2 on the display devices 8a, b, c for the users 6a, b, c. At the monitoring stations 3a, b, c, the monitoring data may be processed and reactions may possibly be triggered, for example control of a monitoring actuator, alarm activation, notification of assistants or emergency services etc.

The monitoring installation 1 comprises a collaboration device 12 having a plurality of collaboration modules 13a, b, c, a collaboration module 13a, b, c respectively being assigned to a monitoring station 3a, b, c. The collaboration modules 13a, b, c may be connected to one another via the network 4 and the monitoring center 5 using data technology. Alternatively, the collaboration device 12 has its own server or the collaboration modules 13a, b, c are in the form of a peer-to-peer network.

The collaboration device 12 is designed to display the user ID of the user 6a of a first monitoring station 3a together with an assigned item of user information as collaboration data with the model 10 on the user interface 9b, c of at least one second monitoring station 3b, c. Optionally, the first user ID is also displayed together with the user information on the monitoring station 3a which is operated at that time by the user 6 having the first user ID.

The collaboration device 12 therefore makes it possible for user information assigned to the user 6 having the first user ID of the monitoring station 3a to be displayed on other monitoring stations 3b, c. It is therefore possible, on the one hand, for the other users 6b, c of the other monitoring stations 3b, c to be able to discern from the user information what the user 6 of the monitoring station 3a is currently doing. Alternatively or additionally, it is possible for the user 6a having the first user ID of the monitoring station 3a to send messages or annotations to the model 10 to the users 6b, c of the other monitoring station 3b, c as user information which is assigned to the user 6a of the monitoring station 3a as a result of the first user ID. The combination of the user ID and the user information is also referred to collaboration data below.

In a first variant, the collaboration data are automatically determined or generated by the collaboration device 12, this being the case, for example, when an item of status information relating to the user 6a having the first user ID with respect to the safety devices 2 is displayed as user information on one or more of the display devices 8b, c of the other monitoring stations 3b, c. For example, the status information can state that the user 6a having the first user ID is currently checking monitoring images from a monitoring camera as a safety device 2 or that the user 6a having the first user ID is currently controlling a safety device 2. Safety devices 2 can be controlled, on the one hand, in safety actuators, for example controllable doors, turnstiles etc. However, it is also possible for the fact that the user 6a having the first user ID is controlling a PTZ (pan-tilt-zoom) monitoring camera as a safety device 2 to be displayed as the status information. This makes it possible to exclude "duplicate control" of a safety device 2 by two users 6a, b, c.

Optionally, the collaboration modules 13a, b, c may each comprise a transmitting module 14a, b, c, with the result that the user 6a having the first user ID can optionally transmit a message as user information together with his user ID as collaboration data to one, some or all other users 6b, c of the collaboration device 12 or monitoring installation 1.

In a further addition or alternative, the collaboration modules 13a, b, c comprise an annotation module 15a, b, c, with the result that the user 6a having the first user ID can add an annotation 20 (FIG. 2) as user information with his user ID to the model 10. In this manner, the user 6a can provide all users 6b, c with an item of information at the same time.

Figure 2:
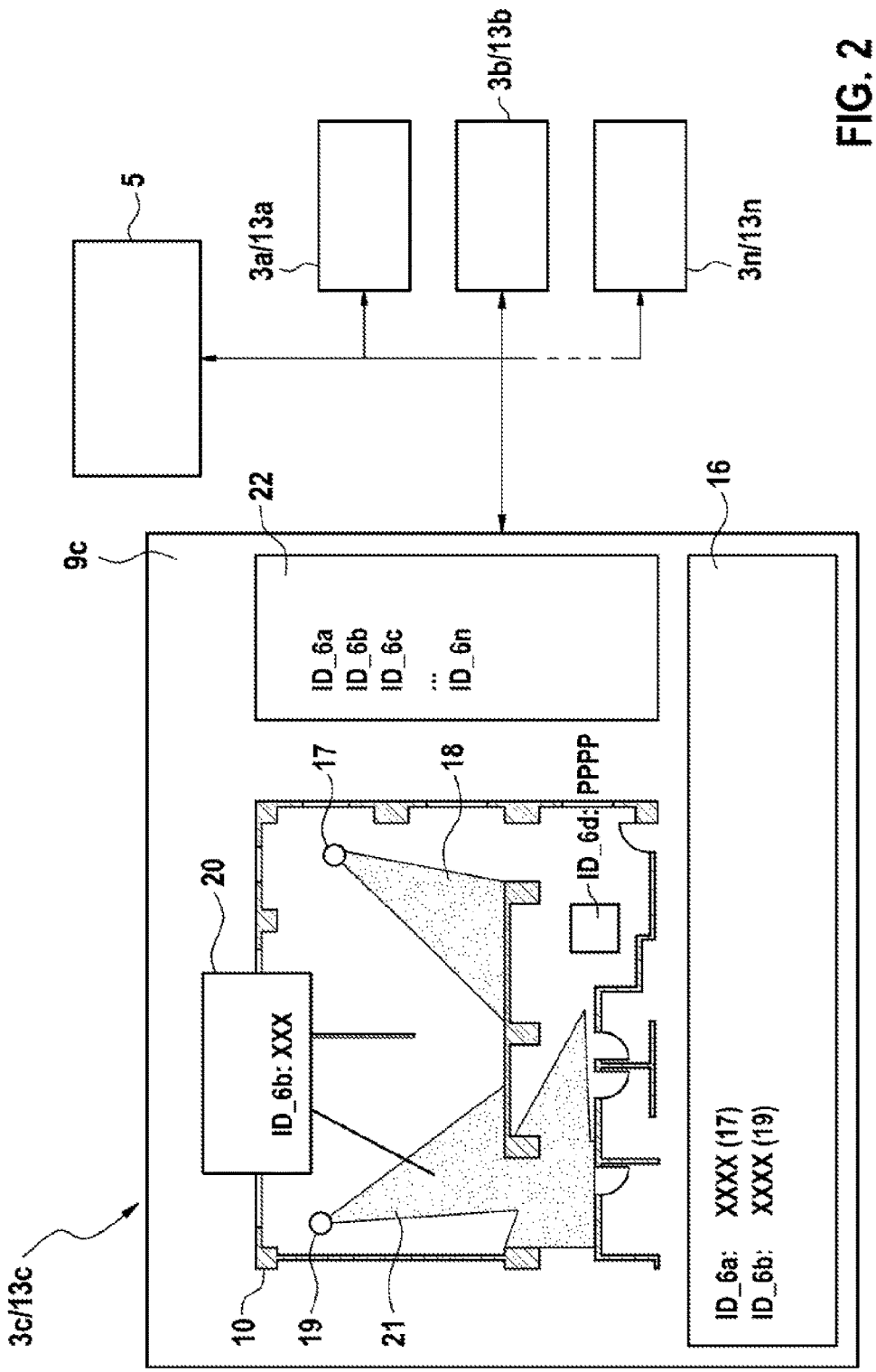
FIG. 2 shows a graphical illustration of a user interface of the monitoring installation in FIG. 1.

FIG. 2 shows a schematic illustration of an exemplary embodiment of the user interface 9c of the user 6c, in which the model 10 is presented in the form of a building outline in this case.

Examples of collaboration data are applied line by line in a first text block 16 displayed below the model 10 in the user interface 9c, the collaboration data each comprising the user ID and an item of user information XXXX relating to one of the users 6a, b, c.

The first line of the text block 16 indicates the user 6a as the user ID and records, as user information XXXX, the status information stating that the user 6a is moving a monitoring camera 17 as an example of a safety device or is checking its monitoring images. These collaboration data may also be graphically presented in the correct position in the model 10, said collaboration data being displayed in the presented viewing angle range 18 of the monitoring camera 17.

The second line in the block 16 presents, as collaboration data, the fact that the user 6b having the user ID ID_6b is emitting an alarm to a second monitoring camera 19 as user information, for example with regard to a range being exceeded, via his transmitting module 14b. The user 6b can optionally append further data, for example monitoring images from the monitoring camera 19, to the collaboration data and can therefore forward them to the other users 6a, c.

Furthermore, the annotation 20 containing the user ID (of the user 6b in this case) and a comment (in this case: "Unknown object. Please check") is introduced in the model 10. The annotation 20 is entered by the user 6b in addition to or independently of the transmitting module 14b via his annotation module 15b and is connected to that viewing angle range 21 of the second monitoring camera 19 in which the user 6b detected the unknown object via a graphical connecting line.

A second text block 22 which shows a list of the users 6a, b, c . . . n is displayed on the right-hand side. Optionally, in addition to the stationary monitoring stations 3a, b, c, the monitoring installation may have one or more mobile monitoring stations 3d, the mobile monitoring station 3d being symbolically represented in the model 10 and the user ID of the user 6d of the mobile monitoring station 3d being displayed together with the spatial coordinates PPPP thereof as user information.

The invention claimed is:

1. A monitoring installation for a monitoring area, the monitoring installation comprising:
a plurality of monitoring stations for users of the monitoring installation, the monitoring installation configured to assign a user ID to each of the users of the monitoring installation,
wherein at least two of the plurality of monitoring stations individually include
a collaboration device that is configured to
output collaboration information regarding a first user of a first monitoring station of the plurality of monitoring stations, the collaboration information including a first user ID of the first user and an assigned item of user information of the first user, the assigned item of user information of the first user is information regarding monitoring tasks assigned to the first user,
detect a second user of one of the at least two of the plurality of monitoring stations performing one or more of the monitoring tasks assigned to the first user, the second user being different from the first user, and
update the collaboration information regarding the first user based on the one or more of the monitoring tasks assigned to the first user being performed by the second user; and
a display device that is configured to display a graphical user interface of the monitoring installation, the graphical user interface includes a model of the monitoring area and the collaboration information.

2. The monitoring installation as claimed in claim 1, wherein the collaboration devices of the at least two of the plurality of monitoring stations are connected to one another directly or via a server to distribute the collaboration information among one another.

3. The monitoring installation as claimed in claim 1, wherein the monitoring installation has a plurality of safety devices, and wherein the collaboration information further includes an item of status information relating to the first user having the first user ID with respect to the plurality of safety devices.

4. The monitoring installation as claimed in claim 3, wherein the collaboration information is displayed in a correct position in the model by virtue of the collaboration information being graphically assigned to the plurality of safety devices in the model.

5. The monitoring installation as claimed in claim 1, wherein the collaboration device further includes a transmitting device, and wherein the first user having the first user ID transmits a message as part of the collaboration information to one, some, or all of the users of the monitoring installation using the transmitting device.

6. The monitoring installation as claimed in claim 5, wherein the collaboration information is displayed in a correct position in the model by virtue of the collaboration information being graphically assigned to a monitoring station of the plurality of monitoring stations containing the first user having the first user ID in the model.

7. The monitoring installation as claimed in claim 5, wherein the message comprises monitoring data relating to the monitoring installation.

8. The monitoring installation as claimed in claim 1, wherein the collaboration device further includes an annotation module, wherein the first user having the first user ID adds an annotation as part of the collaboration information to the model using the annotation module.

9. The monitoring installation as claimed in claim 1, wherein the first monitoring station is a mobile monitoring station, wherein the collaboration information includes an item of location information of the mobile monitoring station, the collaboration information being displayed in a correct position in the model by virtue of the collaboration information being graphically assigned to a position of the mobile monitoring station in the model.

10. A method for operating a monitoring installation, the method comprising:
outputting, with an electronic processor, collaboration information regarding a first user of a first monitoring station of a plurality of monitoring stations, the collaboration information includes a first user ID of the first user and an assigned item of user information of the first user of the first monitoring station, the assigned item of user information of the first user is information regarding monitoring tasks assigned to the first user;
detecting, with the electronic processor, a second user of one of the at least two of the plurality of monitoring stations performing one or more of the monitoring tasks assigned to the first user, the second user being different from the first user, and
updating, with the electronic processor, the collaboration information regarding the first user based on the one or more of the monitoring tasks assigned to the first user being performed by the second user;
generating, with the electronic processor, a graphical user interface, the graphical user interface includes a model of a monitoring area and the collaboration information; and
controlling, with the electronic processor, a display device of a second monitoring station to display the graphical user interface,
wherein the second monitoring station is physically located in a different location than a location of the first monitoring station.

11. A non-transitory computer-readable medium comprising a computer program having program code, that when executed by an electronic processor, causes the electronic processor to perform a set of operations comprising:
outputting collaboration information regarding a first user of a first monitoring station of a plurality of monitoring stations, the collaboration information includes a first user ID of the first user and an assigned item of user information of the first user of the first monitoring station, the assigned item of user information of the first user is information regarding monitoring tasks assigned to the first user;
detecting a second user of one of the at least two of the plurality of monitoring stations performing one or more of the monitoring tasks assigned to the first user, the second user being different from the first user, and
updating the collaboration information regarding the first user based on the one or more of the monitoring tasks assigned to the first user being performed by the second user;
generating a graphical user interface that includes a model of a monitoring area and the collaboration information; and
controlling a display device of a second monitoring station to display the graphical user interface,
wherein the second monitoring station is physically located in a different location than a location of the first monitoring station.

12. The monitoring installation as claimed in claim 1, wherein the at least two of the plurality of monitoring stations are located in different physical locations in the monitoring area.

13. The monitoring installation as claimed in claim 1, wherein the monitoring tasks assigned to the first user include one or more tasks selected from a group consisting of:
checking surveillance images,
monitoring messages from a plurality of safety devices,
monitoring data from the plurality of safety devices,
controlling one or more of the plurality of safety devices, and
messaging the second user.

14. The monitoring installation as claimed in claim 13, wherein the plurality of safety devices includes two or more devices selected from a group consisting of:
a controllable door,
a turnstile,
a pan-tilt-zoom monitoring camera.

15. A monitoring installation for a monitoring area, the monitoring installation comprising:
a plurality of monitoring stations for users of the monitoring installation, the monitoring installation configured to assign a user ID to each of the users of the monitoring installation,
wherein at least two of the plurality of monitoring stations individually include
a collaboration device that is configured to output collaboration information regarding a first user of a first monitoring station of the plurality of monitoring stations, the collaboration information including a first user ID of the first user and an assigned item of user information of the first user, the assigned item of user information of the first user is information regarding a current monitoring task of the first user; and
a display device that is configured to display a graphical user interface of the monitoring installation, the graphical user interface includes a model of the monitoring area and the collaboration information,
wherein a second user of one of the at least two of the plurality of monitoring stations performs a second monitoring task based on the information regarding the current monitoring task of the first user, the second monitoring task being different from the current monitoring task of the first user.

16. The monitoring installation as claimed in claim 15, wherein the current monitoring task of the first user is a task selected from a group consisting of:
checking surveillance images,
monitoring messages from a plurality of safety devices,
monitoring data from the plurality of safety devices,
controlling one or more of the plurality of safety devices, and
messaging the second user.

17. The monitoring installation as claimed in claim 16, wherein the plurality of safety devices includes two or more devices selected from a group consisting of:
a controllable door,
a turnstile,
a pan-tilt-zoom monitoring camera.

* * * * *